(12) United States Patent
Nishimura

(10) Patent No.: US 10,483,277 B2
(45) Date of Patent: Nov. 19, 2019

(54) SEMICONDUCTOR MEMORY DEVICE AND METHOD FOR MANUFACTURING THE SAME

(71) Applicant: Toshiba Memory Corporation, Minato-ku (JP)

(72) Inventor: Jun Nishimura, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 32 days.

(21) Appl. No.: 15/463,169

(22) Filed: Mar. 20, 2017

(65) Prior Publication Data

US 2018/0076215 A1 Mar. 15, 2018

Related U.S. Application Data

(60) Provisional application No. 62/393,986, filed on Sep. 13, 2016.

(51) Int. Cl.
| | |
|---|---|
| *H01L 27/11582* | (2017.01) |
| *H01L 27/11565* | (2017.01) |
| *H01L 23/528* | (2006.01) |
| *H01L 27/1157* | (2017.01) |

(52) U.S. Cl.
CPC .... *H01L 27/11582* (2013.01); *H01L 23/5283* (2013.01); *H01L 27/1157* (2013.01); *H01L 27/11565* (2013.01)

(58) Field of Classification Search
CPC ........................ H01L 27/11582; H01L 23/5283
See application file for complete search history.

(56) References Cited

U.S. PATENT DOCUMENTS

| | | | |
|---|---|---|---|
| 8,188,530 B2 | 5/2012 | Tanaka et al. | |
| 8,338,882 B2 | 12/2012 | Tanaka et al. | |
| 8,958,228 B2 | 2/2015 | Samachisa et al. | |
| 2005/0280061 A1* | 12/2005 | Lee ..................... | H01L 21/2007 257/296 |
| 2013/0248959 A1* | 9/2013 | Matsumoto ........... | H01L 27/088 257/314 |

(Continued)

FOREIGN PATENT DOCUMENTS

JP 2011-187794 9/2011

*Primary Examiner* — Amar Movva
(74) *Attorney, Agent, or Firm* — Oblon, McClelland, Maier & Neustadt, L.L.P.

(57) ABSTRACT

According to one embodiment, a semiconductor memory device includes a substrate, interconnect portions, a conductive layer, a stacked body, and columnar portions. At least one portion of the interconnect portions is provided inside the substrate, each of the interconnect portions extends in a first direction along a surface of the substrate, and the interconnect portions are arranged along a second direction crossing the first direction. The conductive layer is provided on the interconnect portions. The stacked body is provided on the conductive layer and includes electrode layers stacked to be separated from each other, and each of the electrode layers extends in the second direction. The columnar portions are provided inside the stacked body, each of the columnar portions includes a semiconductor portion extending in a stacking direction of the electrode layers and a charge storage film provided between the semiconductor portion and the stacked body.

15 Claims, 16 Drawing Sheets

(56) References Cited

U.S. PATENT DOCUMENTS

2015/0318285 A1* 11/2015 Zhang .............. H01L 27/10844
  257/295
2016/0071855 A1* 3/2016 Park ................. H01L 27/11556
  257/314

* cited by examiner

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/393,986 filed on Sep. 13, 2016; the entire contents of which are incorporated herein by reference.

FIELD

Embodiments described herein relate generally to a semiconductor memory device and a method for manufacturing the same.

BACKGROUND

In recent years, a stacked semiconductor memory device has been proposed in which memory cells are integrated three-dimensionally. In such a semiconductor memory device, a stacked body in which multiple electrode layers are stacked is provided; and channels that pierce the stacked body are provided. Also, memory cells that include a charge storage film are formed at the crossing portions of the electrode layers and the channels. The electrode layers function as control gates of the memory cells and are formed using a conductive material. When the electrode layers are formed using a metal, stress such as compressive stress, tensile stress, or the like is generated in the electrode layers. By the electrode layers being formed to be long in one direction, there is a risk of the warp of the wafer becoming large due to such stress.

DETAILED DESCRIPTION

Figure 1:
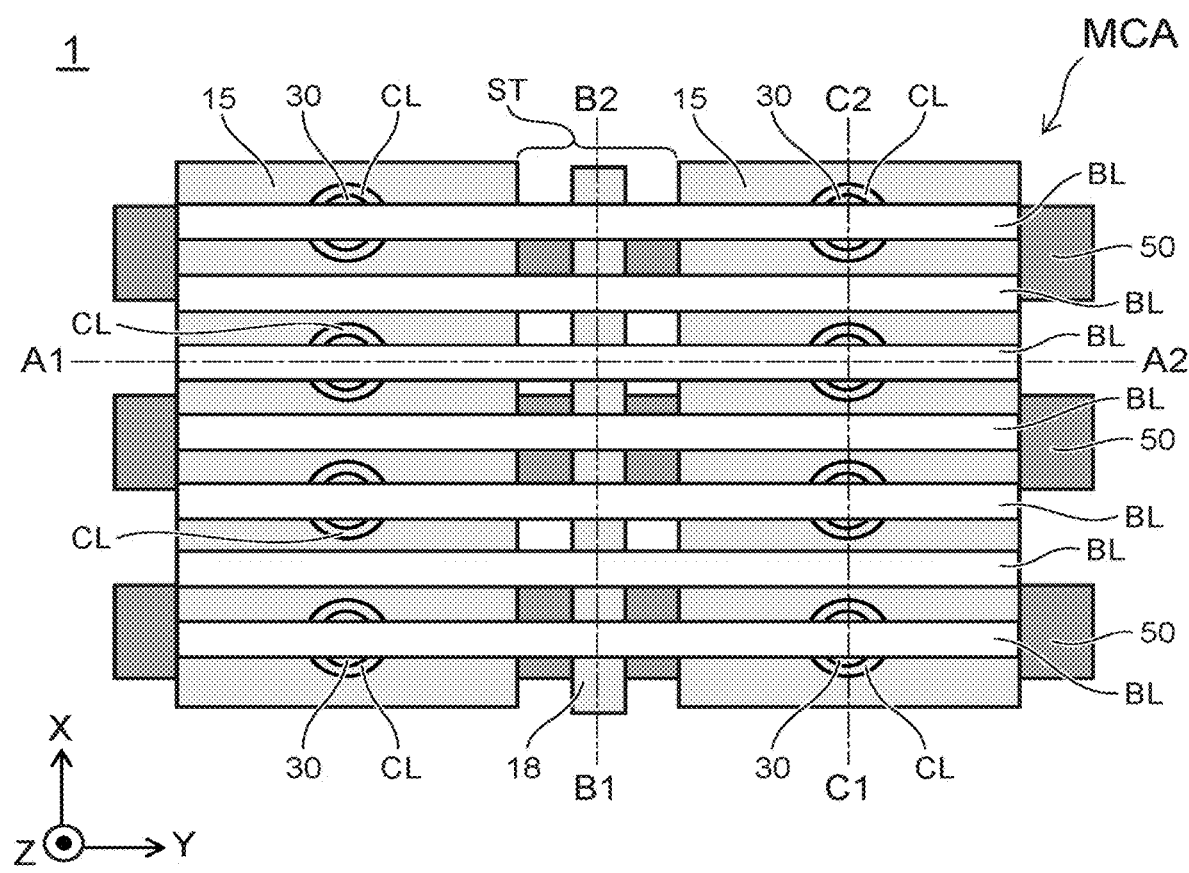
FIG. 1 is a plan view showing a semiconductor memory device according to a first embodiment.

According to one embodiment, a semiconductor memory device includes a substrate, a plurality of interconnect portions, a conductive layer, a stacked body, and a plurality of columnar portions. At least one portion of the plurality of interconnect portions is provided inside the substrate, each of the plurality of interconnect portions extends in a first direction along a surface of the substrate, and the plurality of interconnect portions is arranged along a second direction crossing the first direction. The conductive layer is provided on the plurality of interconnect portions. The stacked body is provided on the conductive layer, the stacked body includes a plurality of electrode layers stacked to be separated from each other, and each of the plurality of electrode layers extends in the second direction. The plurality of columnar portions is provided inside the stacked body, each of the plurality of columnar portions includes a semiconductor portion and a charge storage film, the semiconductor portion extends in a stacking direction of the plurality of electrode layers, and the charge storage film is provided between the semiconductor portion and the stacked body.

Embodiments will now be described with reference to the drawings. In the respective drawings, same members are labeled with same reference numerals.

(First Embodiment)

FIG. 1 shows an enlargement of the plane of a memory cell array MCA of a semiconductor memory device 1.

Figure 2A:
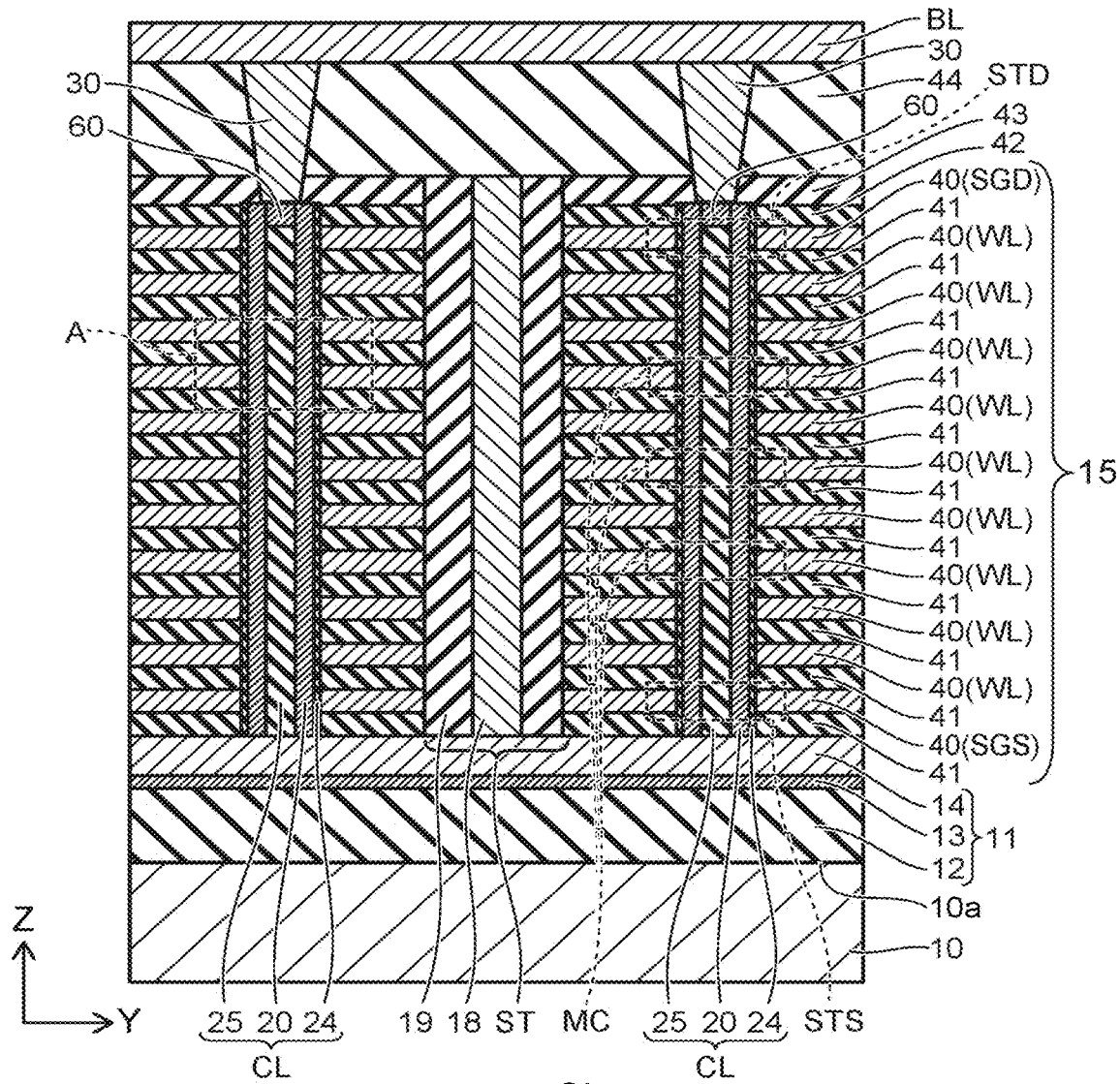
FIG. 2A is a cross-sectional view along line A1-A2 of FIG. 1.
Figure 2B:
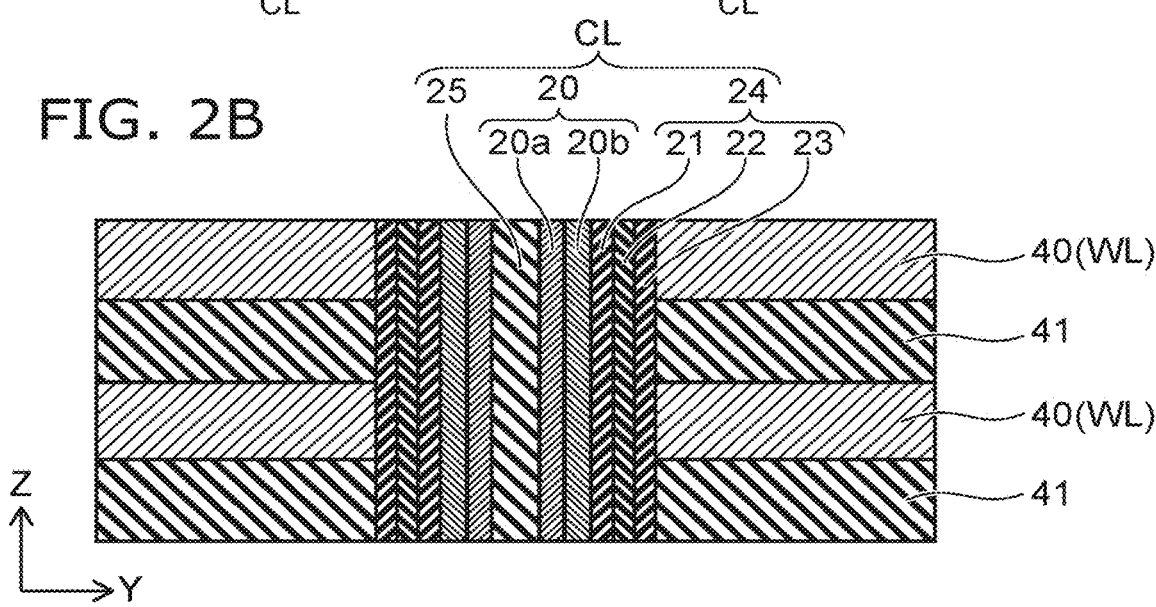
FIG. 2B is an enlarged view of region A of FIG. 2A.

FIG. 2A shows a Y-Z cross section along line A1-A2 of FIG. 1; and FIG. 2B shows an enlargement of region A of FIG. 2A.

Figure 3:
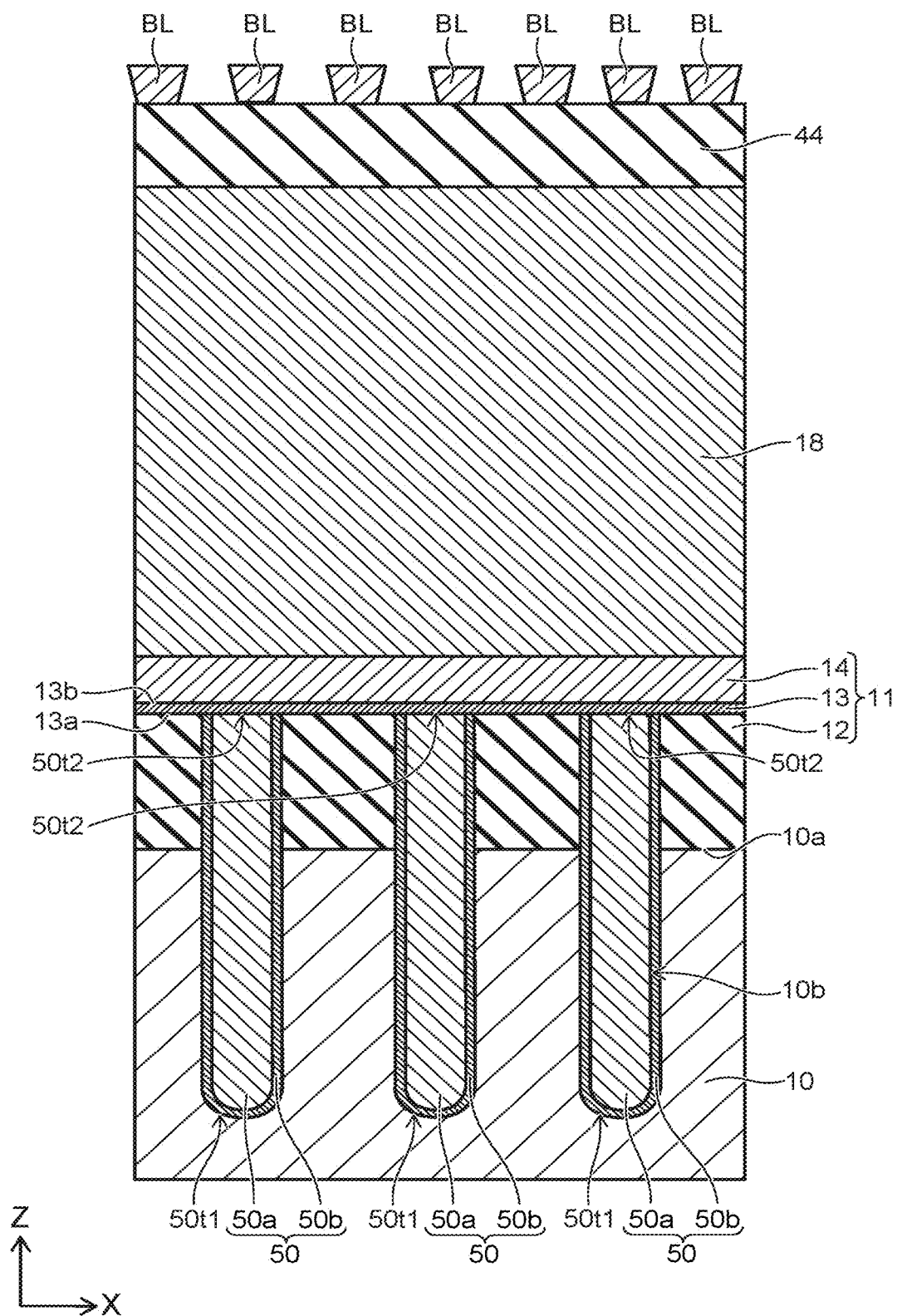
FIG. 3 is a cross-sectional view along line B1-B2 of FIG. 1.
Figure 4:
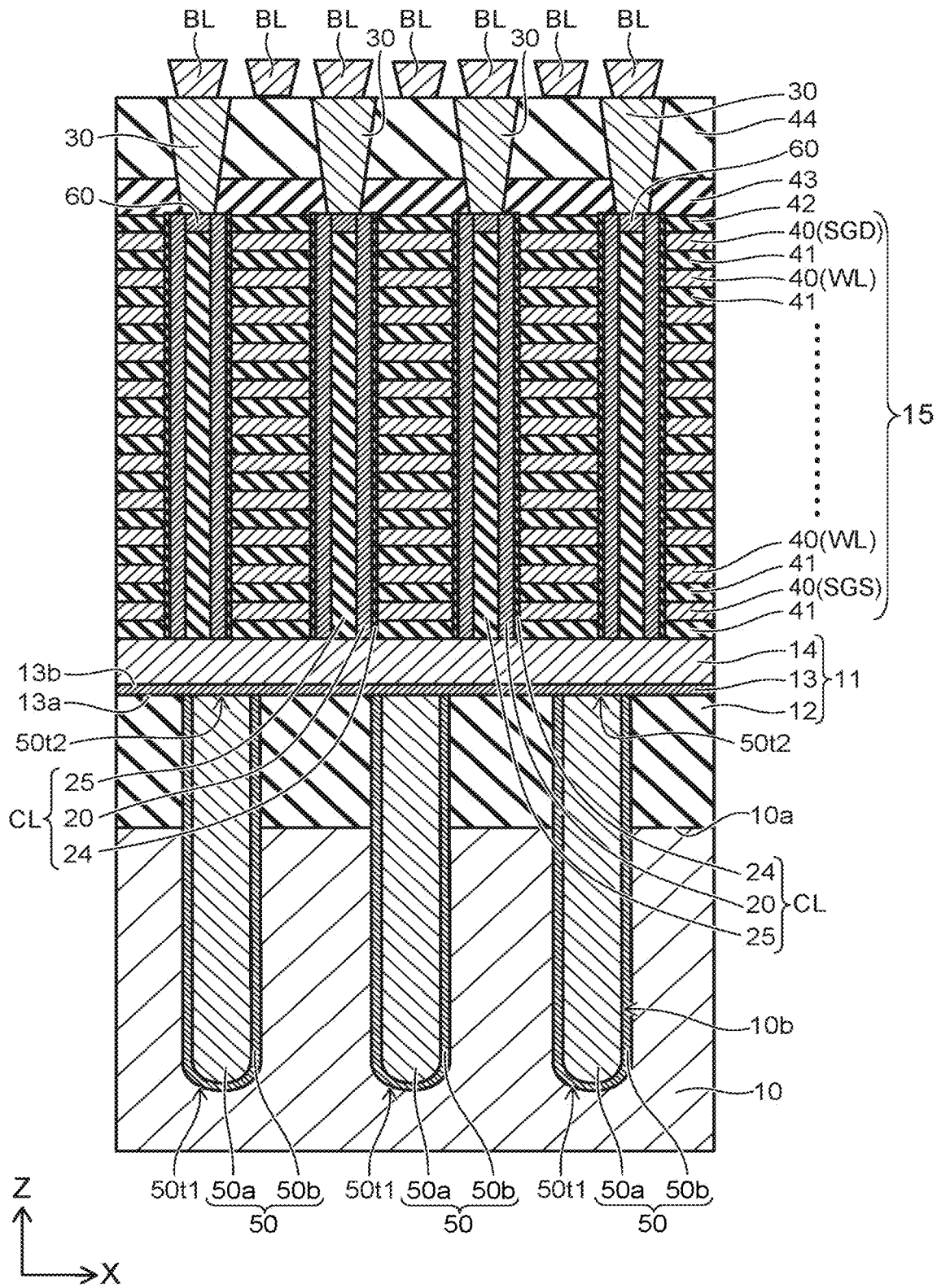
FIG. 4 is a cross-sectional view along line C1-C2 of FIG. 1.

FIG. 3 and FIG. 4 respectively show X-Z cross sections along line B1-B2 and line C1-C2 of FIG. 1.

As shown in FIG. 1, the semiconductor memory device 1 includes a stacked body 15, multiple columnar portions CL, and multiple interconnect portions 50. A slit ST is formed in the semiconductor memory device 1.

As shown in FIG. 2A, a stacked body 11 is provided between a substrate 10 and the stacked body 15. The substrate 10 is a semiconductor substrate and includes, for example, silicon (Si).

In the specification, two mutually-orthogonal directions parallel to an upper surface 10a of the substrate 10 are taken as an X-direction and a Y-direction. A direction orthogonal to both the X-direction and the Y-direction is taken as a Z-direction.

The stacked body 11 includes an insulating layer 12, a barrier layer 13, and a conductive layer 14. The insulating layer 12 is provided on the substrate 10. The insulating layer 12 includes, for example, silicon oxide. The insulating layer 12 includes, for example, TEOS (Tetraethyl orthosilicate). The insulating layer 12 may include multiple layers.

The barrier layer 13 is provided on the insulating layer 12. The barrier layer 13 includes, for example, titanium nitride (TiN). The barrier layer 13 is, for example, a barrier metal layer. The barrier layer 13 may not be provided in the stacked body 11.

The conductive layer 14 is provided on the barrier layer 13. The conductive layer 14 is, for example, an N-type semiconductor layer. For example, the conductive layer 14 includes polysilicon made of amorphous silicon that is crystallized. For example, the conductive layer 14 is an N-type polysilicon layer and includes an N-type impurity such as phosphorus (P), etc., for providing conductivity. The conductive layer 14 may include multiple layers.

Although an N-type semiconductor layer is described as the conductive layer 14 in the embodiment, the embodiment can be realized similarly using a P-type semiconductor layer as well.

The stacked body 15 includes a source-side selection gate SGS, a drain-side selection gate SGD, multiple word lines WL, and the multiple insulating layers 41. The source-side selection gate SGS is provided on the stacked body 11 with the insulating layer 41 interposed. The drain-side selection gate SGD is provided in the uppermost layer of the stacked body 15. The multiple word lines WL are provided between the source-side selection gate SGS and the drain-side selection gate SGD. The source-side selection gate SGS, the multiple word lines WL, and the drain-side selection gate SGD are electrode layers 40. The electrode layers 40 include, for example, a metal such as tungsten (W), etc. The number of stacks of the electrode layers 40 is arbitrary.

The insulating layers 41 are provided between the electrode layers 40. The insulating layers 41 include, for example, silicon oxide (SiO). An insulating layer 42 and an insulating layer 43 are provided in order on the stacked body 15. The insulating layer 42 and the insulating layer 43 include, for example, silicon oxide.

The columnar portion CL is multiply provided inside the stacked body 15. The columnar portion CL extends in the Z-direction through the stacked body 15. For example, the columnar portion CL is formed in a circular columnar configuration or an elliptical columnar configuration. For example, the multiple columnar portions CL are arranged in a prescribed configuration in the X-Y plane.

The columnar portion CL includes a core portion 25, a channel 20 (a semiconductor portion), and a memory film 24. The core portion 25 includes, for example, silicon oxide. The configuration of the core portion 25 is, for example, a circular columnar configuration. The channel 20 is provided around the core portion 25. The configuration of the channel 20 is, for example, a tubular configuration.

The lower ends of the core portion 25 and the channel 20 contact the conductive layer 14 of the stacked body 11. A contact plug 60 that is formed of silicon or the like is provided at the upper end of the core portion 25. The upper end of the contact plug 60 is connected to a contact portion 30.

The memory film 24 is provided around the channel 20. The configuration of the memory film 24 is, for example, a tubular configuration.

As shown in FIG. 2B, the channel 20 includes a body 20a and a cover layer 20b. The cover layer 20b is provided around the body 20a. The body 20a and the cover layer 20b include silicon, e.g., polysilicon made of amorphous silicon that is crystallized.

The memory film 24 includes a tunneling insulating film 21, a charge storage film 22, and a blocking insulating film 23. The tunneling insulating film 21 is provided around the channel 20. The tunneling insulating film 21 includes, for example, silicon oxide.

The charge storage film 22 is provided around the tunneling insulating film 21. The charge storage film 22 includes, for example, silicon nitride (SiN). As shown in FIG. 2A, memory cells MC that include the charge storage film 22 are formed at the crossing portions between the channel 20 and the word lines WL.

The tunneling insulating film 21 is a potential barrier between the charge storage film 22 and the channel 20.

Tunneling of charge occurs in the tunneling insulating film 21 when electrons move from the channel 20 into the charge storage film 22 (a program operation), when the electrons move from the charge storage film 22 into the channel 20, or when holes move from the channel 20 into the charge storage film 22 (an erase operation).

The charge storage film 22 has trap sites that trap the charge inside a film. The threshold of the memory cell MC changes due to the existence/absence of the charge trapped in the trap sites and the amount of the trapped charge. Thereby, the memory cell MC stores information.

The blocking insulating film 23 is provided around the charge storage film 22. For example, the blocking insulating film 23 is a silicon oxide film including silicon oxide or an aluminum oxide film including aluminum oxide (A10). The blocking insulating film 23 may be a stacked film of a silicon oxide film and an aluminum oxide film. The blocking insulating film 23 protects, for example, the charge storage film 22 from the etching when forming the electrode layers 40.

As shown in FIG. 1 and FIG. 2A, multiple bit lines BL that extend in the Y-direction are provided above the columnar portions CL. The upper end of the columnar portion CL is connected to one of the bit lines BL via the contact plug 60 and the contact portion 30. The contact portion 30 is formed of a conductor such as a metal, etc.

The slit ST is formed inside the stacked body 15. The slit ST extends in the Z-direction and the X-direction through the stacked body 15. The slit ST separates the stacked body 15 into a plurality in the Y-direction. The regions that are separated by the slit ST are called "blocks." One columnar portion CL selected from each block is electrically connected to one bit line BL. For example, the erasing of the data is performed by block in the erase operation.

A lower layer source line 18 is provided inside the slit ST. The lower layer source line 18 includes, for example, a metal such as tungsten (W), etc. The lower layer source line 18 extends in the Z-direction and the X-direction. The configuration of the lower layer source line 18 is, for example, a plate configuration. The lower end of the lower layer source line 18 contacts the conductive layer 14 of the stacked body 11. An insulating film 19 is provided on the side wall of the lower layer source line 18 inside the slit ST. The insulating film 19 is positioned between the lower layer source line 18 and the structure body made of the stacked body 15, the insulating layer 42, and the insulating layer 43. The insulating film 19 includes, for example, silicon oxide. The insulating film 19 electrically insulates the lower layer source line 18 and the electrode layers 40 of the stacked body 15.

An insulating layer 44 is provided on the lower layer source line 18, the insulating film 19, and the insulating layer 43. The insulating layer 44 includes, for example, silicon oxide.

An upper layer source line (not illustrated) that extends in the Y-direction is provided above the lower layer source line 18. The upper end of the lower layer source line 18 is connected to the upper layer source line via a contact inside the insulating layer 44. The source line includes the lower layer source line 18 and the upper layer source line.

As shown in FIG. 1, FIG. 3, and FIG. 4, the interconnect portion 50 is multiply provided over the interior of the stacked body 11 from the interior of the substrate 10. The multiple interconnect portions 50 are arranged at a prescribed spacing in the X-direction. The interconnect portion 50 extends in the Y-direction; and the configuration of the interconnect portion 50 is, for example, a plate configuration. For example, the multiple interconnect portions 50 have a line-and-space arrangement in the X-Y plane.

For example, a lower end 50t1 of the interconnect portion 50 is positioned inside the substrate 10 (inside a recess 10b of the substrate 10). For example, the lower end 50t1 contacts the substrate 10. The recess 10b may not be formed in the substrate 10. That is, the interconnect portion 50 may not be positioned in the interior of the substrate 10; and in such a case, the interconnect portion 50 is positioned inside the stacked body 11; and the lower end 50t1 of the interconnect portion 50 is positioned on the upper surface 10a of the substrate 10.

For example, the lower end 50t1 of the interconnect portion 50 has a curved surface that is at least a portion of the lower end 50t1. The lower end 50t1 may be a plane.

An upper end 50t2 of the interconnect portion 50 contacts a lower surface 13a of the barrier layer 13 of the stacked body 11. The lower surface 13a is a surface opposing the insulating layer 12 and is a surface on the side opposite to an upper surface 13b of the barrier layer 13. The conductive layer 14 is positioned on the upper surface 13b of the barrier layer 13.

The interconnect portion 50 includes a main portion 50a and a peripheral portion 50b. The main portion 50a includes, for example, a metal such as tungsten (W), etc.

The peripheral portion 50b is provided on the surface of the main portion 50a. The peripheral portion 50b includes, for example, titanium nitride (TiN). The peripheral portion 50b is, for example, a barrier metal layer. That is, the peripheral portion 50b and the barrier layer 13 of the stacked body 11 cover the main portion 50a. The peripheral portion 50b may not be provided in the interconnect portion 50.

The interconnect portions 50 are electrically connected to the multiple columnar portions CL via the conductive layer 14 and the barrier layer 13 of the stacked body 11. For example, a current flows in the channel 20 of the columnar portion CL by applying a prescribed potential to the conductive layer 14 via the interconnect portions 50. For example, in the case where the conductive layer 14 is an N-type polysilicon layer, the contact resistance between the interconnect portions 50 and the conductive layer 14 decreases as the concentration of the N-type impurity increases. That is, the current flows more easily in the columnar portions CL from the interconnect portions 50 as the concentration of the N-type impurity increases.

As shown in FIG. 2A, a source-side selection transistor STS is formed at the crossing portion between the source-side selection gate SGS and the columnar portion CL; and a drain-side selection transistor STD is formed at the crossing portion between the drain-side selection gate SGD and the columnar portion CL. Also, the memory cells MC are formed at the crossing portions between the columnar portion CL and the word lines WL.

In the source-side selection transistor STS, the source-side selection gate SGS functions as a gate; and in the drain-side selection transistor STD, the drain-side selection gate SGD functions as a gate. In the memory cell MC, the word line WL functions as a gate; and a portion of the columnar portion CL functions as a channel. The multiple memory cells MC are connected in series via the columnar portion CL between the source-side selection transistor STS and the drain-side selection transistor STD.

Figure 5:
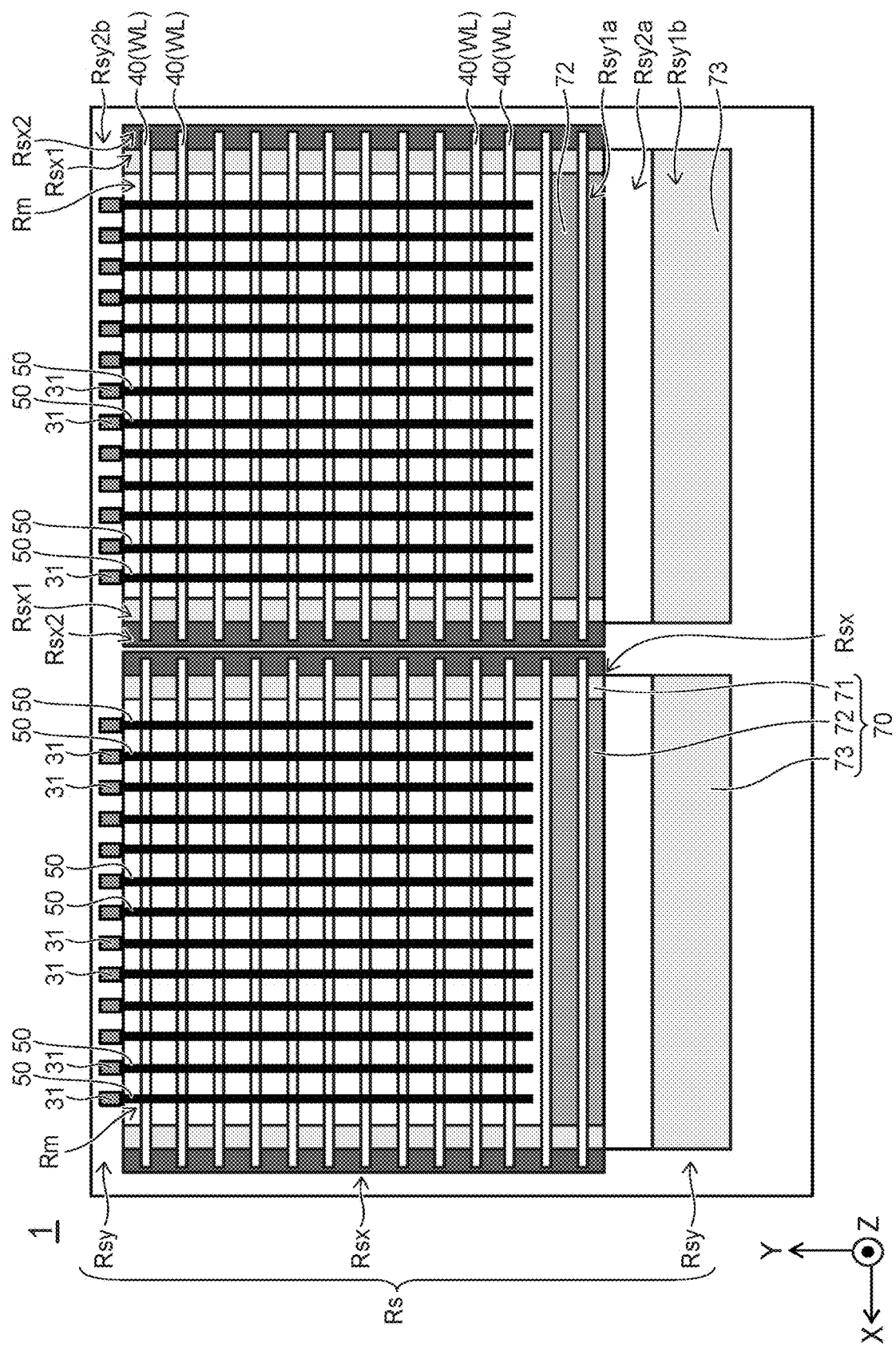
FIG. 5 is a plan view showing the semiconductor memory device according to the first embodiment.

FIG. 5 is a plan view showing the memory cell array MCA and a peripheral circuit 70 of the semiconductor memory device 1.

Figure 6:
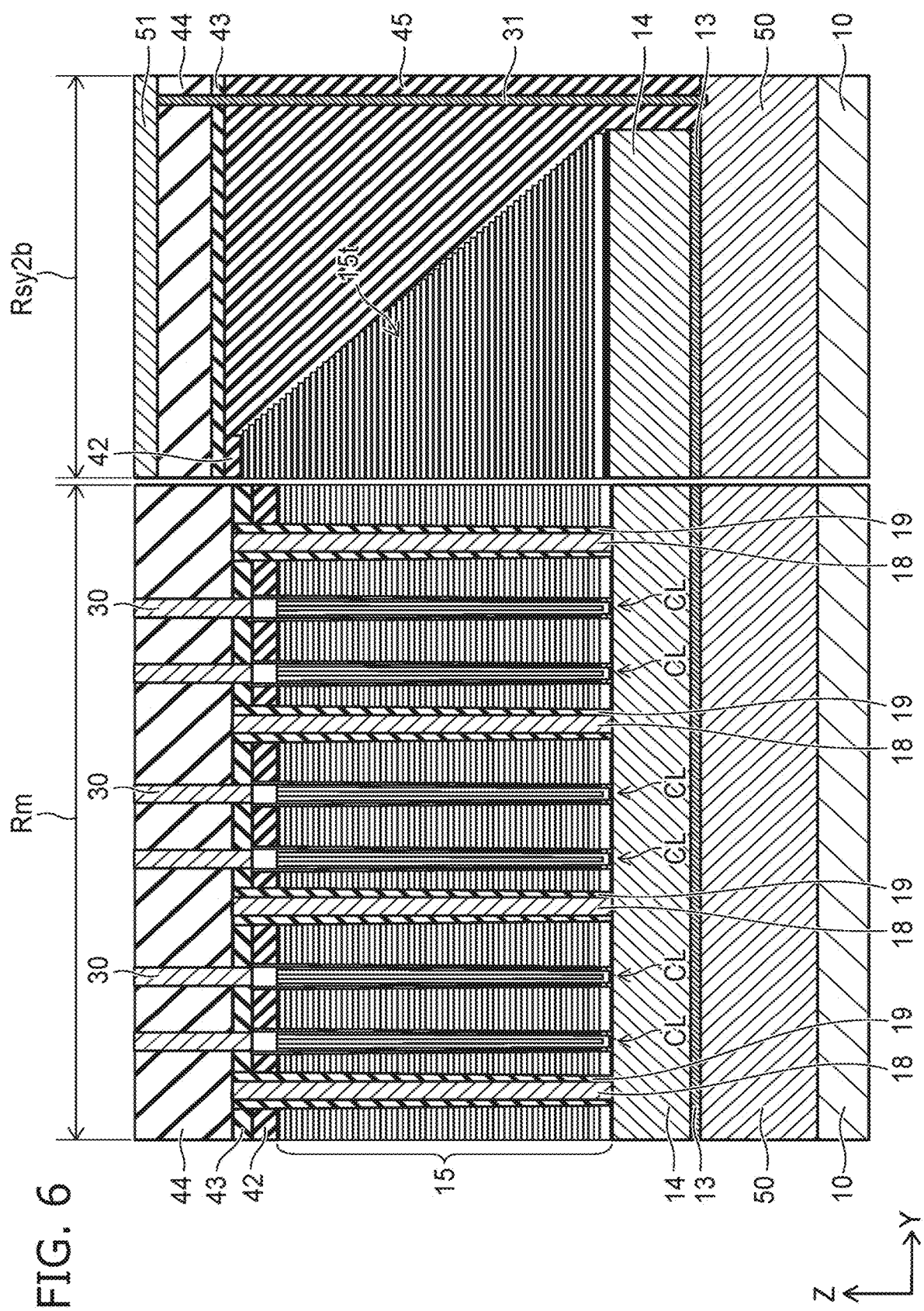
FIG. 6 is a cross-sectional view showing a part of the semiconductor memory device according to the first embodiment.

FIG. 6 shows a Y-Z cross section of a portion of the regions (a memory region Rm and a contact region Rsy2b) shown in FIG. 5.

As shown in FIG. 5 and FIG. 6, the memory region Rm and a peripheral region Rs are provided in the semiconductor memory device 1. The memory region Rm is a region where a memory cell array MCA such as that described above is provided. In the memory region Rm, the multiple interconnect portions 50 extend in the Y-direction.

The peripheral region Rs includes a peripheral region Rsx provided at two ends of the memory region Rm in the X-direction, and a peripheral region Rsy provided at two ends of the memory region Rm in the Y-direction.

The peripheral region Rsx includes a circuit region Rsx1 and a contact region Rsx2. The circuit region Rsx1 is a region on the inner side of the peripheral region Rsx and is provided to be adjacent to the memory region Rm in the X-direction. The contact region Rsx2 is a region on the outer side of the peripheral region Rsx and is provided to be adjacent to the circuit region Rsx1 in the X-direction.

For example, a row decoder 71 is provided in the circuit region Rsx1. The row decoder 71 includes a word line drive circuit that selects the word line WL corresponding to the memory cell MC and generates a potential to be supplied to the word line WL. For example, the row decoder 71 is positioned inside the circuit region Rsx1 and inside the insulating layer 12 between the substrate 10 and the barrier layer 13. Because the row decoder 71 is provided on two sides of the memory cell array MCA, the row decoder 71 can access all of the word lines WL of the memory cell array MCA.

An end portion of the stacked body 15 is provided in the contact region Rsx2; and the configuration of the end portion is a staircase configuration. A step is formed every electrode layer 40 at the end portion of the staircase configuration; and a connection to an upper layer interconnect is provided via a contact provided on the step. Also, the upper layer interconnect is connected to the row decoder 71 of the circuit region Rsx1.

The peripheral region Rsy includes circuit regions Rsy1a and Rsy1b and contact regions Rsy2a and Rsy2b. The circuit region Rsy1a, the contact region Rsy2a, and the circuit region Rsy1b are provided at one end in the Y-direction of the memory region Rm and are arranged in this order from the memory region Rm side. The contact region Rsy2b is provided at the other end in the Y-direction of the memory region Rm.

For example, a sense amplifier 72 is provided in the circuit region Rsy1a. The sense amplifier 72 includes a bit line amplifier circuit that generates a potential to be supplied to the bit line BL in the program operation and amplifies the potential of the bit line BL in the read operation. For example, the sense amplifier 72 is positioned inside the insulating layer 12 between the substrate 10 and the barrier layer 13 inside the circuit region Rsy1a.

For example, a control circuit 73 is provided in the circuit region Rsy1b. The control circuit 73 is a logic circuit electrically connected to the row decoder 71 and the sense amplifier 72. Also, the peripheral circuit 70 includes the row decoder 71, the sense amplifier 72, and the control circuit 73.

The end portion of the stacked body 15 is provided in the contact region Rsy2a; and the configuration of the end portion is a staircase configuration. However, the end portion of the staircase configuration is a dummy portion; and contacts, etc., are not provided in this end portion. A contact (not illustrated) that is connected to the bit line BL extending in the Y-direction is provided inside the contact region Rsy2a on the outer side of the end portion having the staircase configuration. The contact extends in the Z-direction; and one end of the bit line BL is connected to the sense amplifier 72 of the circuit region Rsy1a via the contact.

As shown in FIG. 6, an end portion 15t of the stacked body 15 is provided in the contact region Rsy2b; and the configuration of the end portion 15t is a staircase configuration. However, the end portion 15t that has the staircase configuration is a dummy portion; and contacts, etc., are not provided at the end portion 15t. An insulating layer 45 is provided on the end portion 15t. The insulating layer 45 includes, for example, silicon oxide. The insulating layer 45 covers the end portion 15t. The insulating layer 43 and the insulating layer 44 are provided in order on the insulating layer 45.

The multiple interconnect portions 50 extend in the Y-direction in the contact region Rsy2b. That is, the multiple interconnect portions 50 extend from the memory region Rm to the contact region Rsy2b. In the example shown in FIG. 6, although the interconnect portions 50 are provided from the memory region Rm to the contact region Rsy2b without being divided, the interconnect portions 50 may be divided partway. In such a case, the interconnect portions 50 may include multiple conductive portions extending in the Y-direction, and connection portions connecting these conductive portions. Contact portions 31 are provided on the outer side of the end portion 15t having the staircase configuration inside the contact region Rsy2b. The contact portions 31 are connected to the interconnect portions 50 and extend in the Z-direction through the insulating layer 45 and the insulating layers 43 and 44. The contact portions 31 are formed of a conductor such as a metal, etc. The upper ends of the contact portions 31 are connected to upper layer interconnects 51 provided above the interconnect portions 50. For example, the upper layer interconnects 51 are connected to a potential supply circuit (not illustrated) inside the peripheral region Rs; and a prescribed potential is applied to the conductive layer 14 from the potential supply circuit via the upper layer interconnects 51, the contact portions 31, and the interconnect portions 50.

A method for manufacturing the semiconductor memory device according to the first embodiment will now be described.

Figure 13:
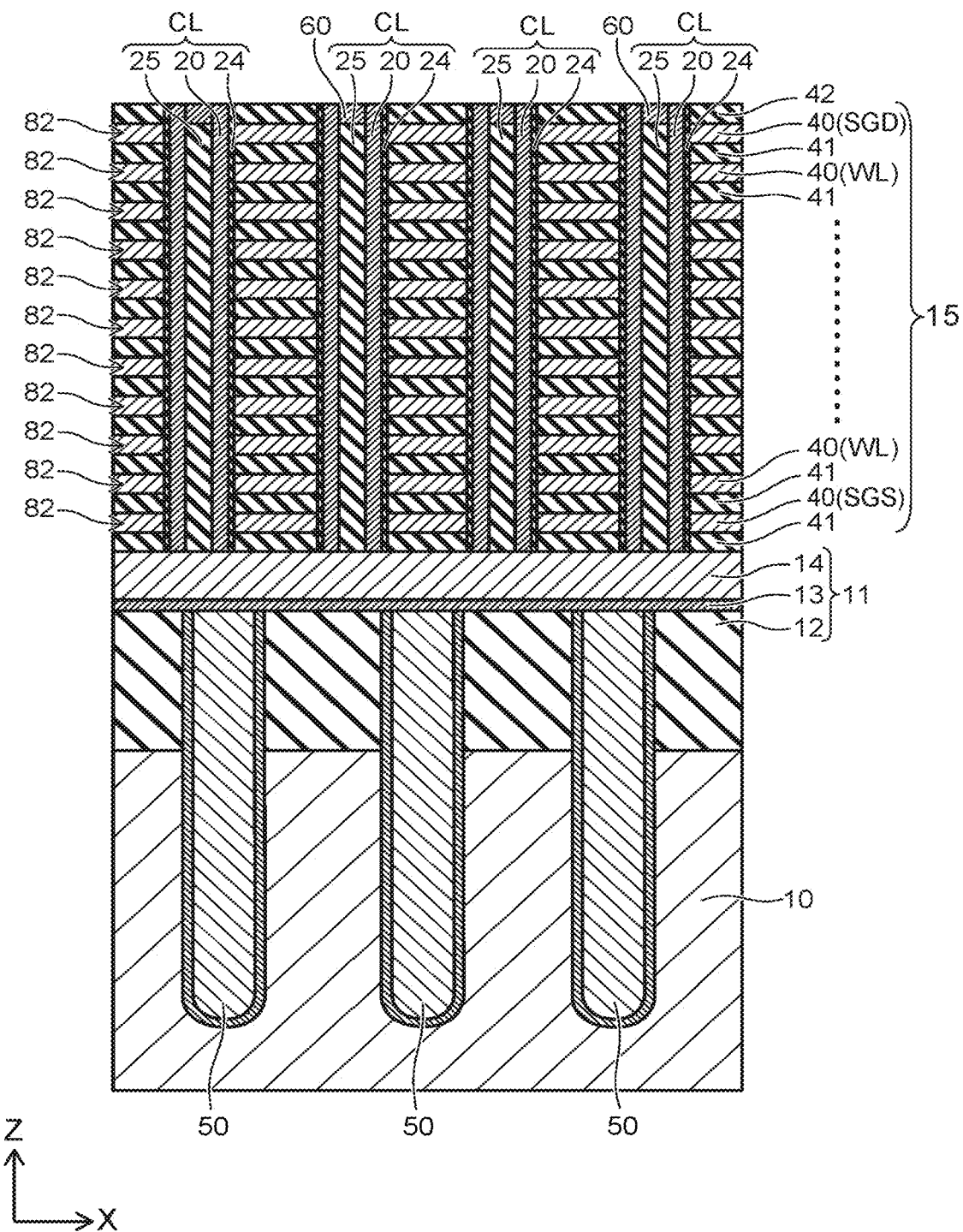
Figure 14:
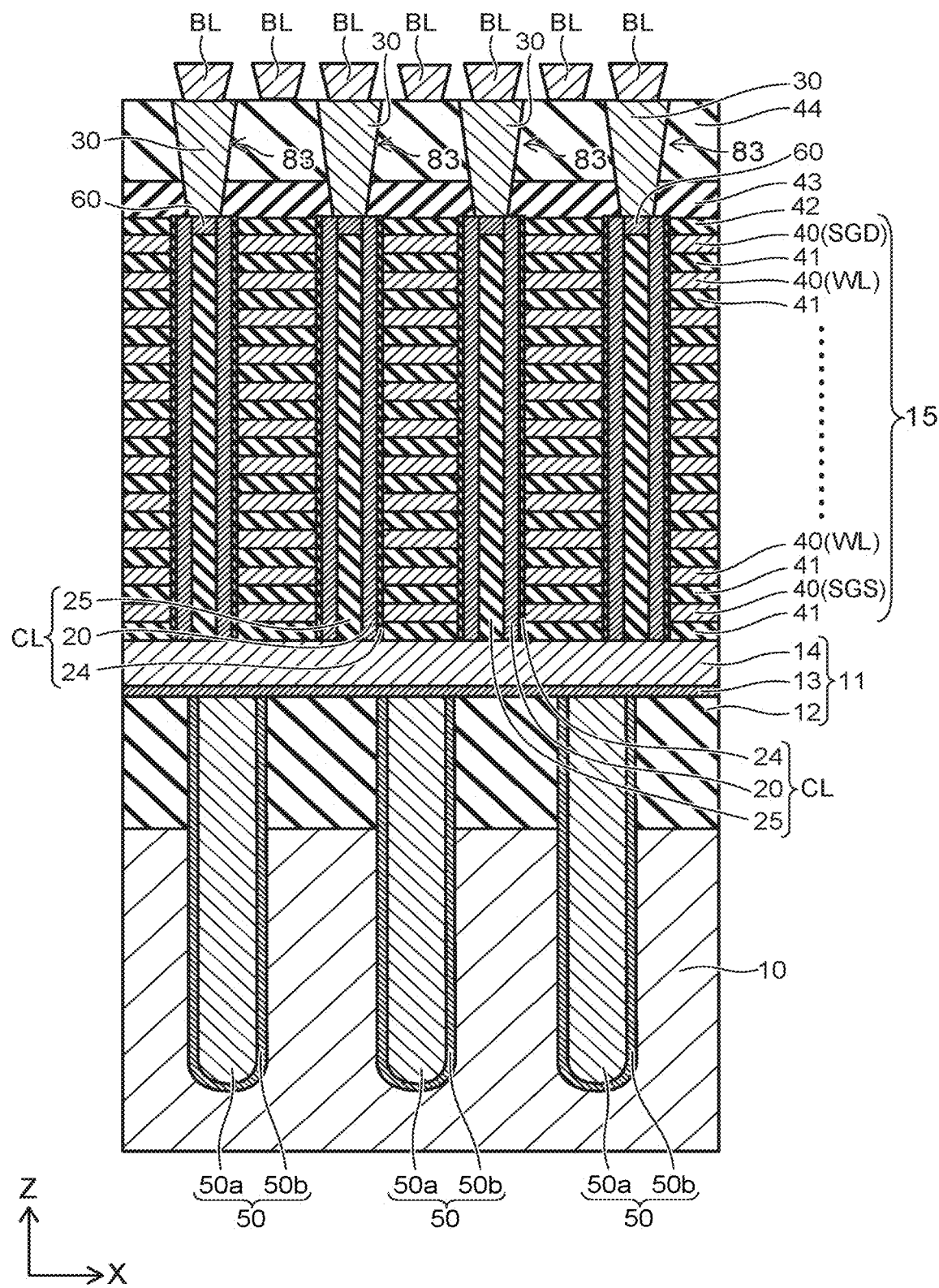
Figure 15:
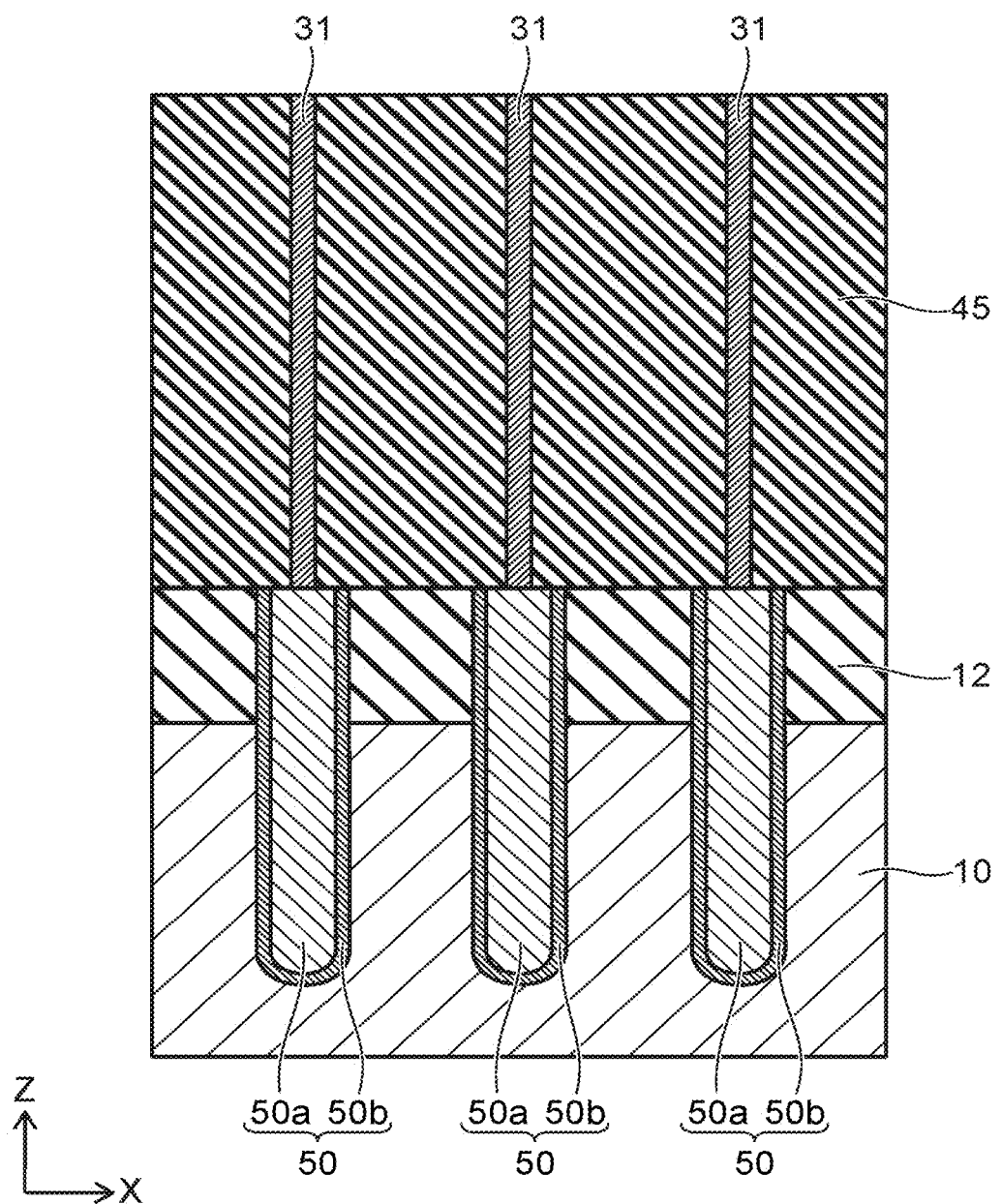

FIG. 7 to FIG. 15 are cross-sectional views showing the method for manufacturing the semiconductor memory device according to the first embodiment. FIG. 7 to FIG. 14 are cross sections corresponding to FIG. 4 and show the X-Z cross section in the memory region Rm of FIG. 5. FIG. 15 shows the X-Z cross section in the contact region Rsy2b of FIG. 5. The method for manufacturing the memory region Rm and the contact region Rsy2b of the semiconductor memory device 1 will now be described.

Figure 7:
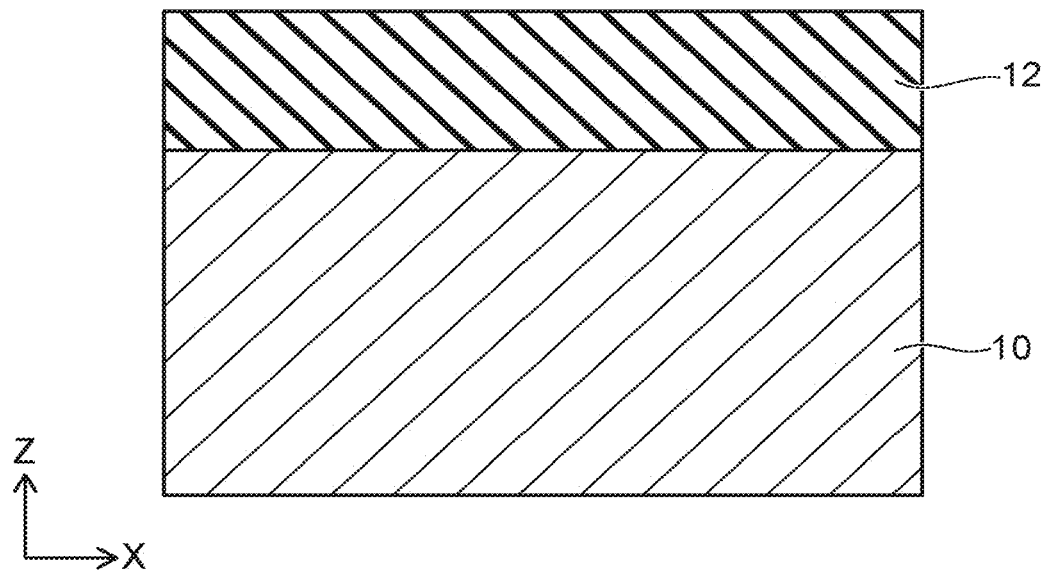
FIG. 7 to FIG. 15 are cross-sectional views showing a manufacturing method of the semiconductor memory device according to the first embodiment.

First, as shown in FIG. 7, the insulating layer 12 is formed by depositing TEOS on the substrate 10.

Figure 8:
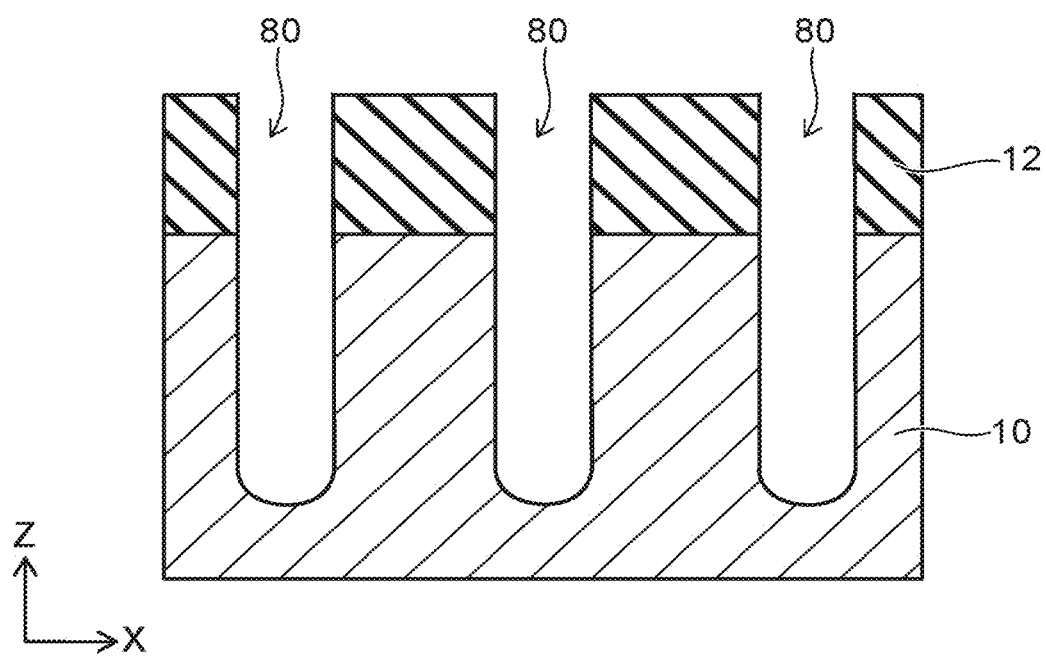

Then, as shown in FIG. 8, for example, multiple recesses 80 are formed in the substrate 10 and the insulating layer 12 by lithography and RIE (Reactive Ion Etching). The multiple recesses 80 are formed at a prescribed spacing in the X-direction. The recesses 80 extend in the Y-direction; and the bottom surfaces of the recesses 80 are, for example, curved surfaces.

Figure 9:
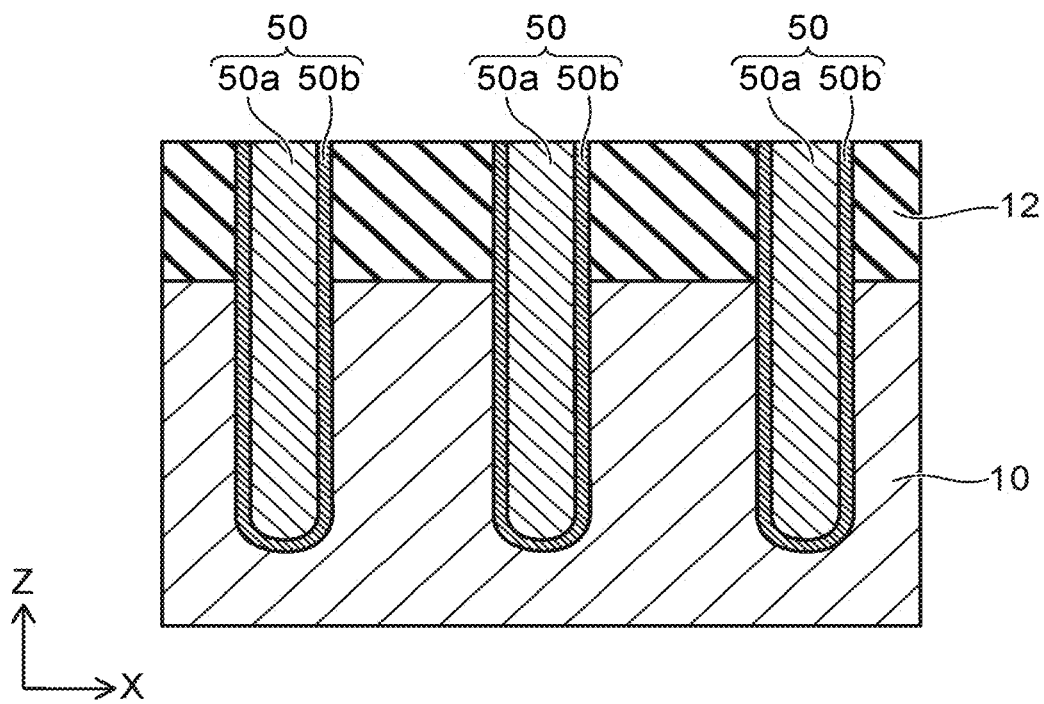

Then, as shown in FIG. 9, for example, after forming the peripheral portion 50b by depositing titanium nitride on the inner surfaces of the recesses 80 by CVD (Chemical Vapor Deposition), the main portion 50a is formed by depositing tungsten on the peripheral portion 50b inside the recesses 80. Thereby, the interconnect portions 50 that include the main portion 50a and the peripheral portion 50b are formed. For example, the multiple interconnect portions 50 are formed in a line-and-space configuration in the X-Y plane.

Figure 10:
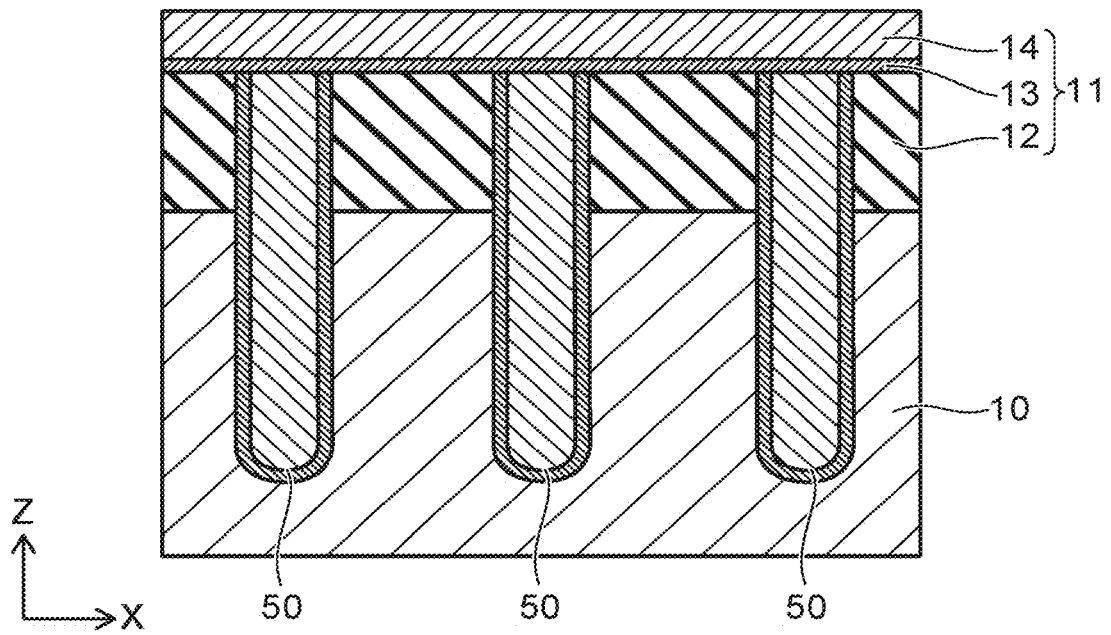

Then, as shown in FIG. 10, for example, after forming the barrier layer 13 by depositing titanium nitride on the insulating layer 12 by CVD, a polysilicon layer is deposited on the barrier layer 13. The barrier layer 13 is formed also on the interconnect portions 50. Continuing, an N-type impurity such as phosphorus (P) or the like is implanted into the polysilicon layer by ion implantation, etc. Thereby, the conductive layer 14 which is an N-type polysilicon layer is formed. Also, the stacked body 11 that includes the insulating layer 12, the barrier layer 13, and the conductive layer 14 is formed.

Figure 11:
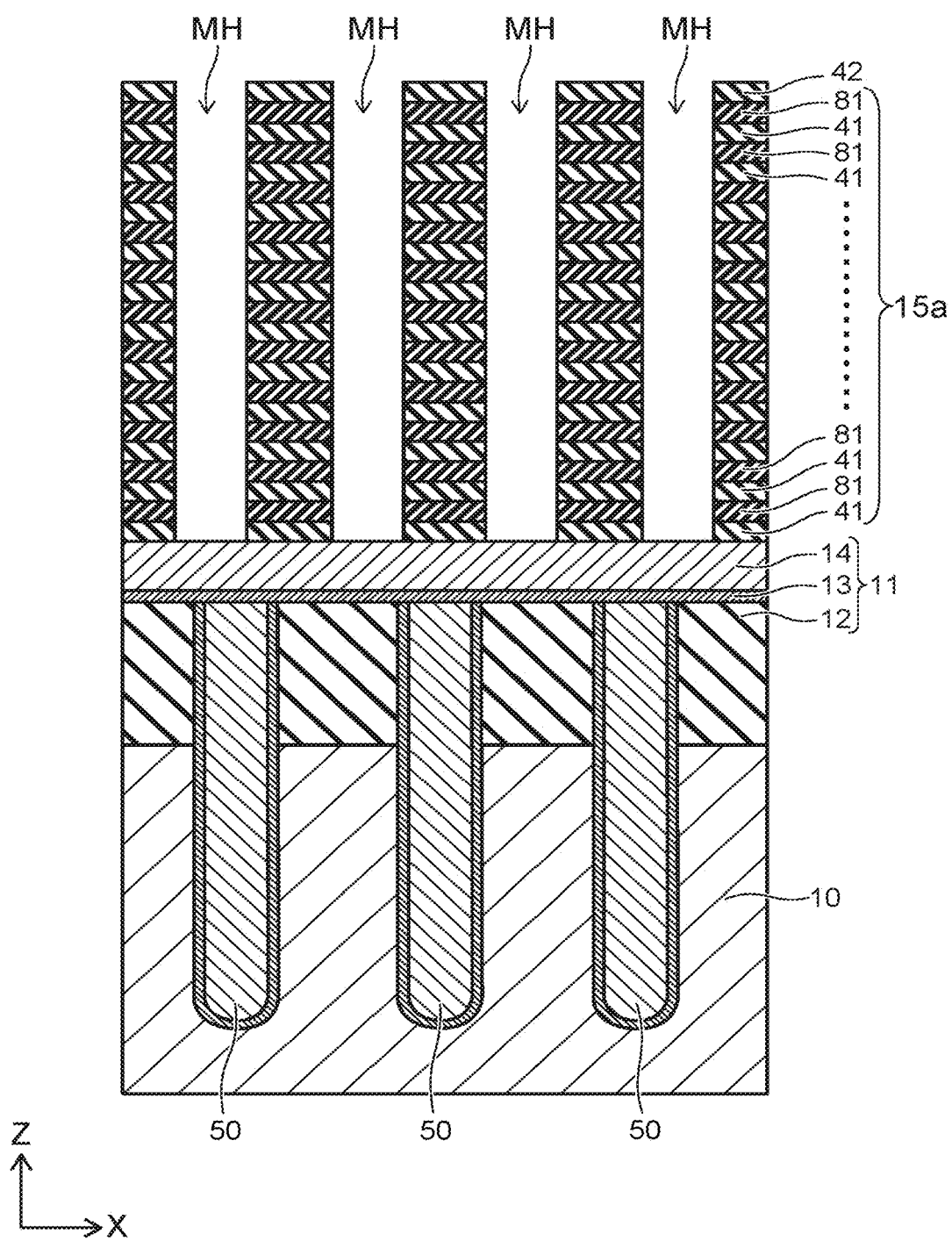

Then, as shown in FIG. 11, for example, a stacked body 15a is formed on the stacked body 11 (the conductive layer 14) by CVD by stacking the insulating layer 41 and a sacrificial layer 81 alternately along the Z-direction. The sacrificial layer 81 is formed of a material that can have etching selectivity with the insulating layer 41 and is formed of, for example, silicon nitride. Continuing, after forming the insulating layer 42 by depositing silicon oxide on the stacked body 15a, for example, memory holes MH (through-holes) are formed in the stacked body 15a by lithography and RIE. The memory holes MH pierce the stacked body 15a and the insulating layer 42 and reach the conductive layer 14.

Figure 12:
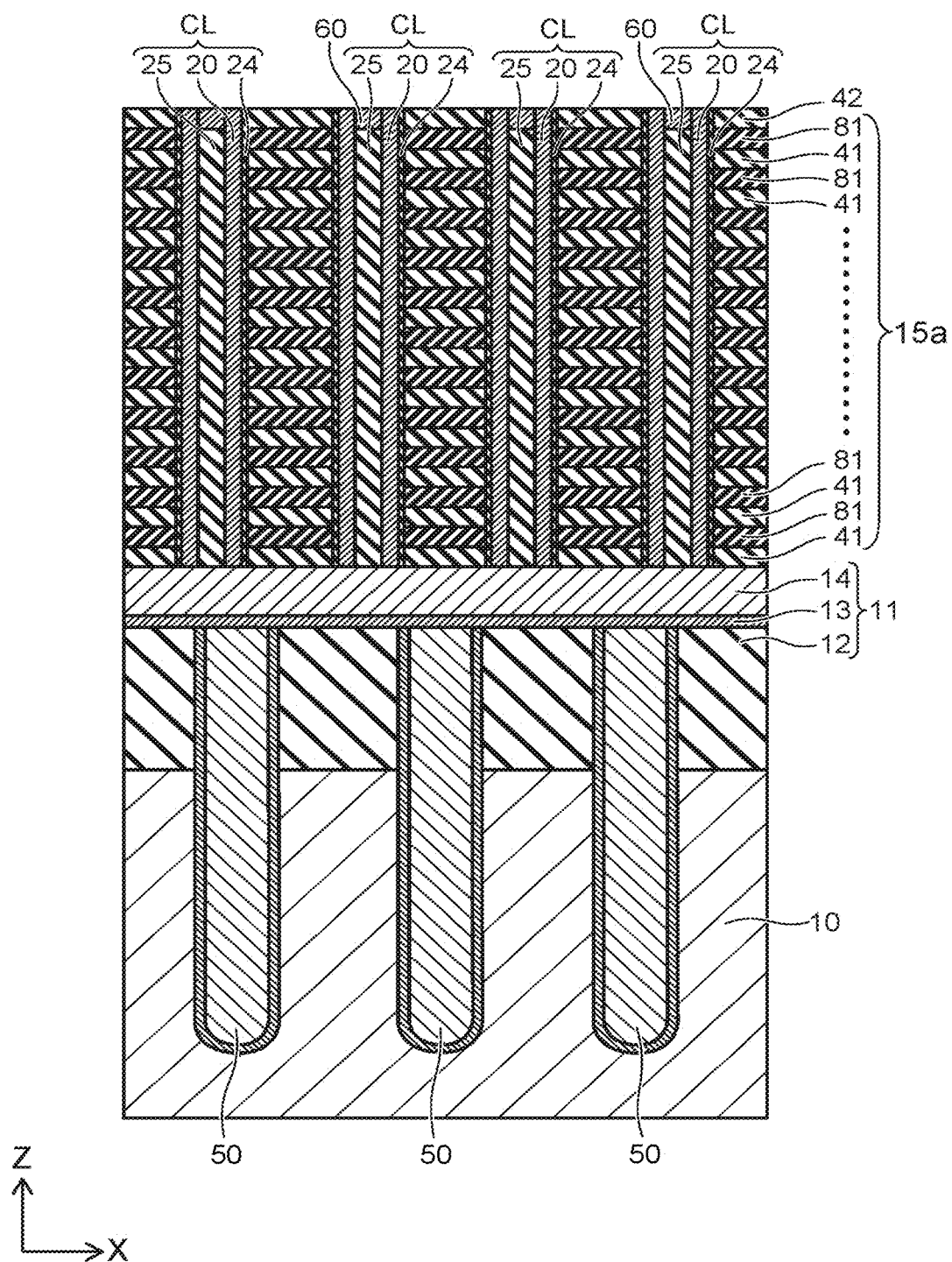

Then, as shown in FIG. 12 using, for example, CVD, the blocking insulating film 23 is formed by depositing silicon oxide on the inner surfaces of the memory holes MH; the charge storage film 22 is formed by depositing silicon nitride; and the tunneling insulating film 21 is formed by depositing silicon oxide. Subsequently, the conductive layer 14 is exposed by removing the blocking insulating film 23, the charge storage film 22, and the tunneling insulating film 21 that are on the bottom surfaces of the memory holes MH by performing RIE. Thereby, the memory film 24 that includes the tunneling insulating film 21, the charge storage film 22, and the blocking insulating film 23 is formed.

Continuing, the cover layer 20b and the body 20a are formed by depositing silicon; and the core portion 25 is formed by depositing silicon oxide. Thereby, the channel 20 that includes the cover layer 20b and the body 20a is formed. The channel 20 contacts the conductive layer 14. Also, the columnar portion CL that includes the core portion 25, the channel 20, and the memory film 24 is formed. Subsequently, the upper portion of the core portion 25 is removed by performing etch-back; and the contact plug 60 is formed by filling silicon.

Then, as shown in FIG. 13, for example, the slit ST that extends in the X-direction and the Z-direction (referring to FIG. 1) is formed in the stacked body 15a by anisotropic etching such as RIE, etc. Continuing, the sacrificial layers 81 are removed by performing wet etching via the slit ST. For example, in the case where the sacrificial layers 81 are formed of silicon nitride, processing is performed using hot phosphoric acid by using phosphoric acid as the etchant of the wet etching. A gap 82 is formed by removing the sacrificial layers 81 via the slit ST.

Continuing, for example, the electrode layers 40 are formed by depositing tungsten inside the gap 82 by CVD. Thereby, the stacked body 15 that includes the source-side selection gate SGS, the drain-side selection gate SGD, the multiple word lines WL, and the multiple insulating layers 41 is formed. Subsequently, after forming the insulating film 19 on the interior wall surface of the slit ST, the lower layer source line 18 is formed by depositing tungsten on the insulating film 19 inside the slit ST (referring to FIG. 1).

Then, as shown in FIG. 14, after forming the insulating layer 45 covering the end portion 15t of the stacked body 15 (referring to FIG. 6), the insulating layer 43 and the insulating layer 44 are formed in order on the insulating layers 42 and 45. Continuing, for example, contact holes 83 are formed in the regions directly above the contact plugs 60 by lithography and RIE. The contact holes 83 pierce the insulating layer 43 and the insulating layer 44 and reach the contact plugs 60.

Continuing, the contact portions 30 are formed by depositing a metal such as tungsten, etc., inside the contact holes 83. Subsequently, the bit lines BL are formed on the contact portions 30.

Then, as shown in FIG. 15, in the contact region Rsy2b, for example, contact holes 84 are formed in the regions directly above the main portions 50a of the interconnect portions 50 by lithography and RIE. The contact holes 84 pierce the insulating layer 45 and reach the main portions 50a. Continuing, the contact portions 31 are formed by depositing a metal such as tungsten, etc., inside the contact holes 84. Subsequently, the upper layer interconnects 51 are formed on the contact portions 31.

Thus, the semiconductor memory device 1 according to the first embodiment is manufactured.

Effects of the first embodiment will now be described. In the semiconductor memory device having the three-dimensional structure, the electrode layers have a stacked structure that becomes longer in the X-direction as the number of columnar portions arranged in the electrode layers increases. Also, in the case where the electrode layers are formed of a metal material, tensile stress is generated easily in the X-direction and compressive stress is generated easily in the Y-direction; therefore, such stress is generated on one surface of the substrate; and the substrate warps greatly.

The direction of the warp of the substrate is different between the X-direction and the Y-direction due to the difference of the stress generated in the X-direction and the Y-direction. Also, in the case where the electrode films have the stacked structure that is long in the X-direction, it is difficult to divide the electrode films in the X-direction; and it is difficult to reduce the warp of the substrate in the X-direction. Thereby, the stress is easily applied in the X-direction; the difference between the warp amount in the X-direction of the substrate and the warp amount in the Y-direction of the substrate becomes large; therefore, the warp of the substrate becomes large.

Also, multiple semiconductor memory devices are manufactured by forming a structure body on a wafer including a substrate and by dicing the wafer and the structure body. Thereby, the warp of the substrate appears as the warp of the wafer prior to the dicing. The large warp of the wafer reduces the patterning precision in the manufacturing processes and impedes stable operations of the manufacturing apparatuses.

In the semiconductor memory device 1 of the embodiment, the interconnect portions 50 are provided over the interior of the stacked body 11 from the interior of the substrate 10 to extend in a direction (the Y-direction) orthogonal to the direction (the X-direction) in which the electrode layers 40 extend. By providing such interconnect portions 50, for example, the tensile stress of the Y-direction can be equal to the tensile stress of the X-direction. Thereby, the difference between the warp amount in the X-direction of the substrate 10 and the warp amount in the Y-direction of the substrate 10 can be reduced. Accordingly, the warp of the substrate 10 can be suppressed; and the warp and/or breaking of the wafer can be suppressed. Here, the interconnect portions 50 are provided to extend in the Y-direction. A member including a material which has the tensile stress, for example, including silicon nitride may be provided to extend in the Y-direction. Thereby, same effects of the stress as described above are obtained.

Also, in the erase operation of the semiconductor memory device, in the selected block (the block to be erased), an erasing potential Verase is applied to the P-well region including silicon formed on the substrate; and after setting the source line to be floating, a potential that is lower than the erasing potential Verase is applied to the source-side selection gate and the drain-side selection gate. Thereby, electron holes (holes) flow in the channels of the columnar portions; and on the other hand, electrons flow in the direction of the P-well region. Accordingly, because a potential that is near the erasing potential Verase is generated in the channels of the memory cells, the electrons of the charge storage films of the memory cells are removed and the erasing of the data is performed when 0 V is applied to the word lines of the selected block.

In the embodiment, the interconnect portions 50 are electrically connected to the channels 20 of the columnar portions CL via the stacked body 11 (the barrier layer 13 and the conductive layer 14). Also, in the embodiment, as shown in FIG. 5 and FIG. 6, in the erase operation of the semiconductor memory device 1, the erasing potential Verase is applied to the conductive layer 14 (e.g., the P-type semiconductor layer) by applying a potential to the interconnect portions 50 from the upper layer interconnects 51 via the contact portions 31. Thereby, in the erase operation of the semiconductor memory device 1, the interconnect resistance can be reduced compared to the case where the holes are supplied to the channels 20 by directly applying the potential to the P-well region from one end of the memory region Rm; therefore, the increase of the interconnect delay (the RC delay) can be suppressed. Accordingly, the holes flow more easily in the channels 20; and the operating characteristics such as the erase operation, etc., of the semiconductor memory device 1 can be improved.

Further, in the embodiment, by forming the interconnect portions 50 in the semiconductor memory device 1, the widths in the X-direction and the Y-direction of the memory region Rm can be reduced. Thereby, the row decoder 71 and the sense amplifier 72 can be provided around the memory cell array MCA. That is, as shown in FIG. 5, the circuit region Rsx1 that includes the row decoder 71 is positioned at the two ends in the X-direction of the memory region Rm including the memory cell array MCA; and the circuit region Rsy1a that includes the sense amplifier 72 is positioned at one end in the Y-direction of the memory region Rm including the memory cell array MCA. Accordingly, the row decoder 71 and the sense amplifier 72 can be provided in the space made by reducing the widths in the X-direction and the Y-direction of the memory region Rm.

According to the embodiments described above, a semiconductor memory device can be realized in which the warp of the substrate is relaxed and the stability of the operations is improved.

(Second Embodiment)

Figure 16:
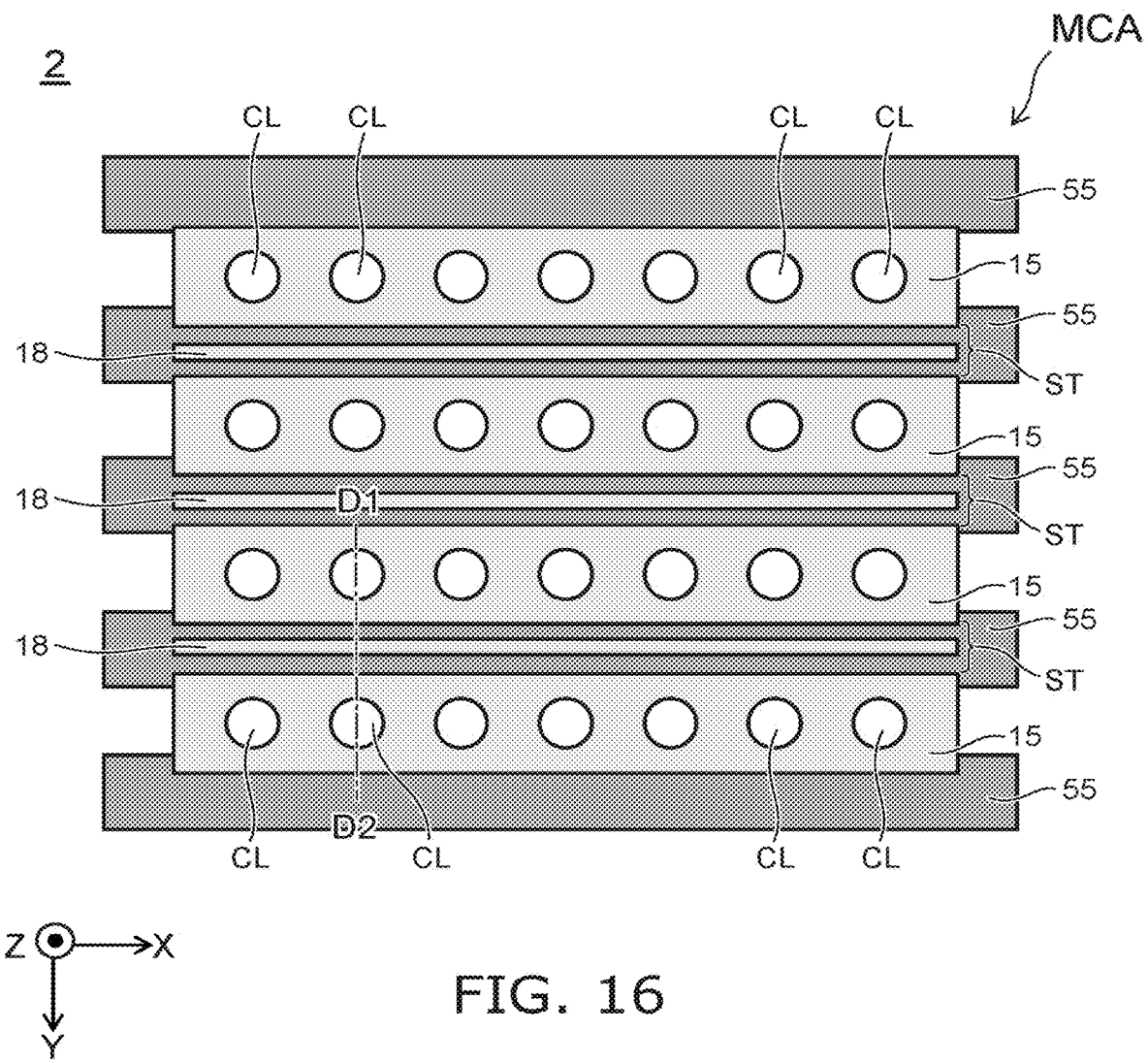
FIG. 16 is a plan view showing a semiconductor memory device according to a second embodiment.
Figure 17:
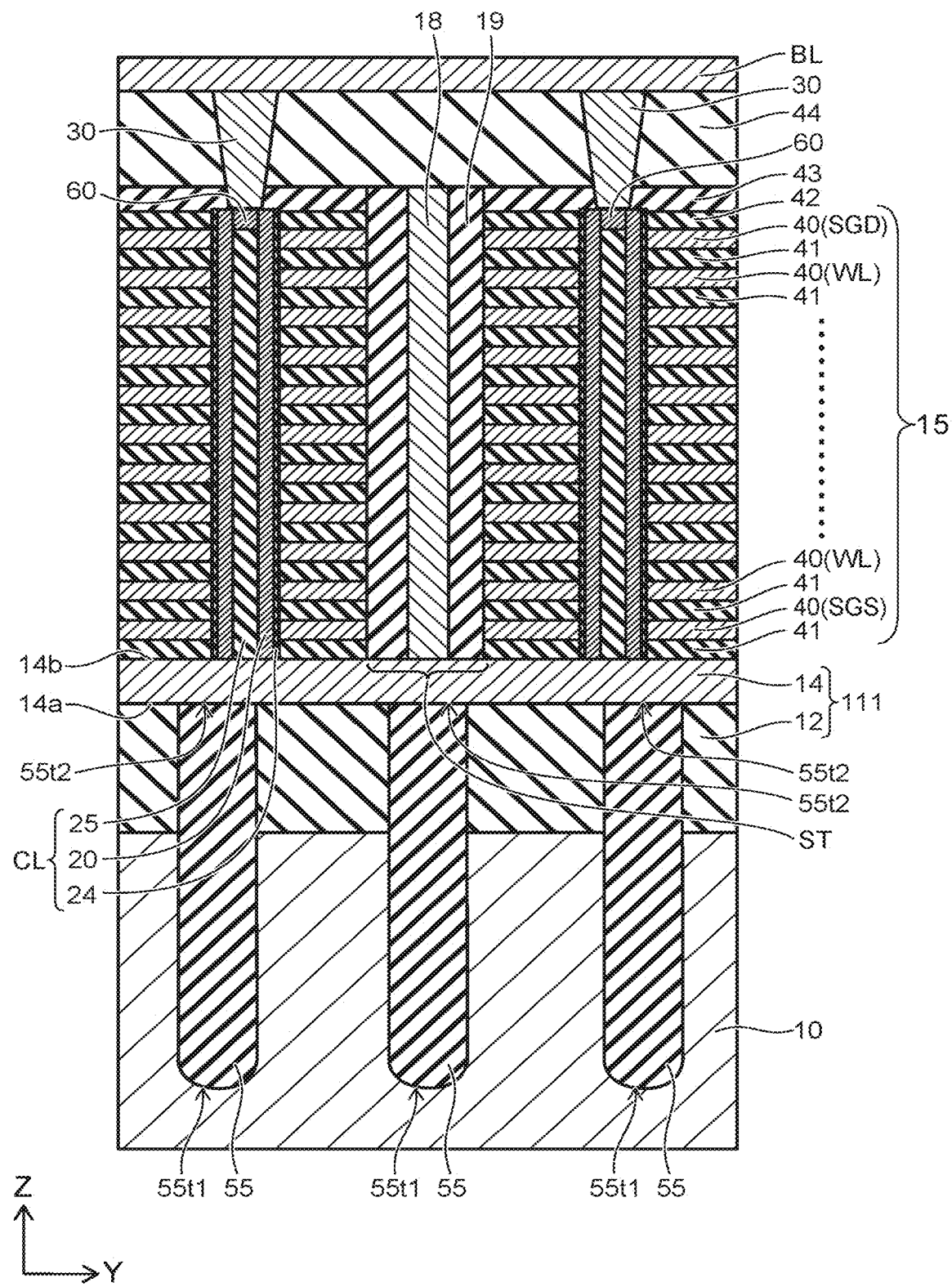
FIG. 17 is a cross-sectional view along line D1-D2 of FIG. 16.

FIG. 16 shows an enlargement of the plane of the memory cell array MCA of the semiconductor memory device 2. FIG. 17 shows a Y-Z cross section line D1-D2 of FIG. 16.

Figure 18:
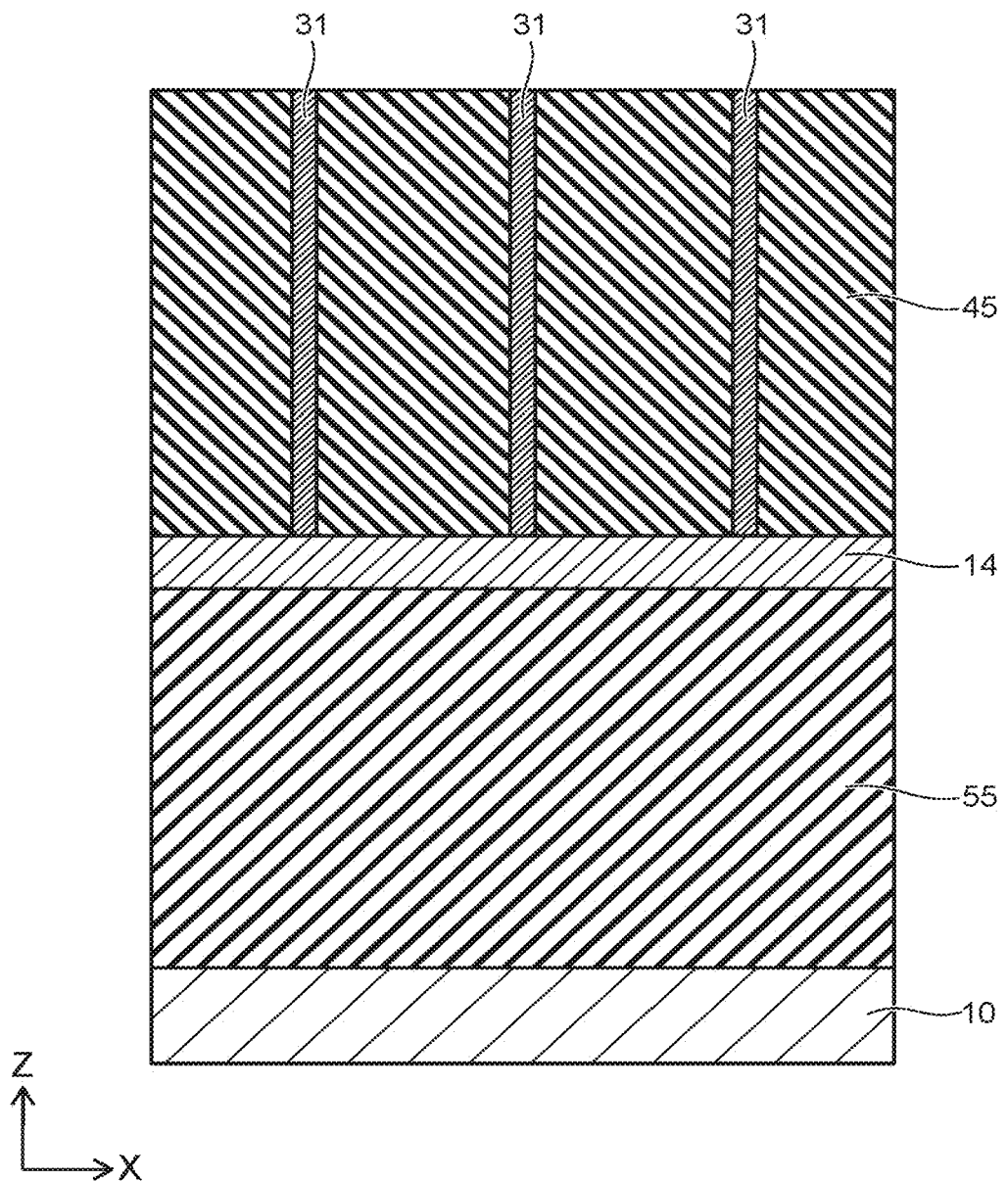
FIG. 18 is a cross-sectional view showing a part of the semiconductor memory device of the second embodiment.

FIG. 18 shows an X-Z cross section of a portion of the semiconductor memory device 2.

FIG. 18 is an X-Z cross section in the contact region Rsy2b of FIG. 5 and corresponds to the cross section of FIG. 15. The embodiment differs from the first embodiment in that insulating portions 55 are formed instead of the interconnect portions 50. Other than the insulating portions 55, the configurations are the same as those of the first embodiment; and a detailed description of the other configurations is therefore omitted.

As shown in FIG. 16 and FIG. 17, the semiconductor memory device 2 includes the stacked body 15, the multiple columnar portions CL, and the multiple insulating portions 55. Also, a stacked body 111 is provided between the substrate 10 and the stacked body 15. The stacked body 111 includes the insulating layer 12 and the conductive layer 14. The insulating layer 12 is provided on the substrate 10; and the conductive layer 14 is provided on the insulating layer 12. The conductive layer 14 includes, for example, a metal such as tungsten, etc.

The insulating portions 55 are multiply provided over the interior of the stacked body 111 from the interior of the substrate 10. The multiple insulating portions 55 are arranged at a prescribed spacing in the Y-direction. The insulating portions 55 extend in the X-direction; and the configurations of the insulating portions 55 are, for example, plate configurations. For example, the multiple insulating portions 55 have a line-and-space arrangement in the X-Y plane.

A lower end 55t1 of the insulating portion 55 is positioned inside the substrate 10 and contacts, for example, the substrate 10. An upper end 55t2 of the insulating portion 55 contacts a lower surface 14a of the conductive layer 14 of the stacked body 111. The lower surface 14a is a surface that opposes the insulating layer 12 and is the surface on the side opposite to an upper surface 14b of the conductive layer 14. The insulating portion 55 includes, for example, silicon oxide. The insulating portion 55 is a silicon oxide film formed by heat treatment of a film including, for example, polysilazane. The insulating portion 55 may be a film including amorphous silicon.

As shown in FIG. 18, the contact portions 31 are provided inside the contact region Rsy2b. The contact portions 31 are connected to the conductive layer 14 and extend in the Z-direction through the insulating layer 45. The upper ends of the contact portions 31 are connected to the upper layer interconnect 51 provided above the conductive layer 14 (referring to FIG. 6). For example, a prescribed potential is applied to the conductive layer 14 via the upper layer interconnect 51 and the contact portions 31.

Effects of the second embodiment will now be described.

In the semiconductor memory device 2 of the embodiment, the insulating portions 55 are provided over the interior of the stacked body 111 from the interior of the substrate 10 to extend along the direction (the X-direction) in which the electrode layers 40 extend. By providing such insulating portions 55, the X-direction component of the stress generated in the electrode layers 40 (the tensile stress, etc.) can be reduced. Thereby, the difference between the warp amount in the X-direction of the substrate 10 and the warp amount in the Y-direction of the substrate 10 can be reduced. Accordingly, the warp of the substrate 10 can be suppressed; and the warp and/or breaking of the wafer can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
    a substrate;
    a plurality of interconnect portions, at least one portion of the plurality of interconnect portions being provided inside the substrate, each of the plurality of interconnect portions extending in a first direction along a surface of the substrate, the plurality of interconnect portions being arranged along a second direction, the second direction crossing the first direction and being along the surface of the substrate, the plurality of interconnect portions having a line-and-space arrangement arranged along the second direction;
    a conductive layer provided on the plurality of interconnect portions;
    a stacked body provided on the conductive layer, the stacked body including a plurality of electrode layers stacked to be separated from each other, each of the plurality of electrode layers extending in the second direction; and
    a plurality of columnar portions provided inside the stacked body, each of the plurality of columnar portions including a semiconductor portion and a charge storage film, the semiconductor portion extending in a stacking direction of the plurality of electrode layers, the charge storage film being provided between the semiconductor portion and the stacked body,
    the plurality of electrode layers being disposed continuously over two or more of the plurality of interconnect portions arranged along the second direction,
    one interconnect portion of the plurality of interconnect portions overlapping two or more sets of the plurality of electrode layers when viewed from the stacking direction, the two or more sets of the plurality of electrode layers extending in the second direction respectively and being separated in the first direction from each other.

2. The semiconductor memory device according to claim 1, wherein one of the plurality of interconnect portions includes a main portion and a peripheral portion, the peripheral portion being provided on a surface of the main portion.

3. The semiconductor memory device according to claim 2, wherein the main portion includes tungsten, and the peripheral portion includes titanium nitride.

4. The semiconductor memory device according to claim 1, further comprising:
    an insulating layer provided between the interconnect portions in the second direction; and
    a first layer including titanium nitride and being provided between the conductive layer and the plurality of interconnect portions and between the conductive layer and the insulating layer.

5. The semiconductor memory device according to claim 4, wherein upper ends of the plurality of interconnect portions contact a lower surface of the first layer.

6. The semiconductor memory device according to claim 1, wherein a configuration of one of the plurality of interconnect portions is a plate configuration, the substrate has a plurality of recesses formed to a prescribed depth from the surface, and lower ends of the plurality of interconnect portions are positioned inside the plurality of recesses.

7. The semiconductor memory device according to claim 1, wherein the plurality of interconnect portions is positioned inside a first region and inside a second region, the plurality of columnar portions being provided in the first region, one end of the stacked body in the first direction being provided in the second region, the second region being adjacent to the first region in the first direction.

8. The semiconductor memory device according to claim 7, further comprising a plurality of contact portions extending in the stacking direction, being provided inside the second region, and connecting the plurality of interconnect portions.

9. The semiconductor memory device according to claim 7, further comprising:
   a first drive circuit provided inside a third region adjacent to the first region in the second direction; and
   a second drive circuit provided inside a fifth region, the fifth region being positioned between the first region and a fourth region, another end of the stacked body in the first direction being provided in the fourth region.

10. The semiconductor memory device according to claim 1, wherein
   the conductive layer includes polysilicon, and
   the conductive layer contacts the semiconductor portion.

11. The semiconductor memory device according to claim 1, further comprising:
   a first interconnect extending in the stacking direction and the second direction, being provided inside the stacked body, and contacting the conductive layer; and
   a plurality of second interconnects extending in the first direction and being provided on the plurality of columnar portions.

12. A method of manufacturing the semiconductor memory device of claim 1, comprising:
   forming a first layer on the substrate;
   forming a plurality of recesses in the substrate and the first layer, each of the plurality of recesses extending in a first direction along a surface of the substrate, the plurality of recesses being arranged along a second direction crossing the first direction;
   forming interconnect portions inside the plurality of recesses;
   forming the conductive layer on the first layer and the plurality of interconnect portions;
   forming the stacked body on the conductive layer by alternately stacking an insulating layer and a second layer;
   forming a through-hole in the stacked body, the through-hole extending in a stacking direction of the stacked body; and
   forming the semiconductor portion inside the through-hole.

13. The method for manufacturing the semiconductor memory device according to claim 12, wherein the forming of the interconnect portions includes forming a peripheral portion including titanium nitride on an inner surface of the plurality of recesses, and forming a main portion including tungsten on the peripheral portion.

14. The method for manufacturing the semiconductor memory device according to claim 12, further comprising:
   forming a slit inside the stacked body, the slit extending in the stacking direction and the second direction;
   removing the second layers via the slit; and
   forming, via the slit, an electrode layer inside a gap where the second layers are removed.

15. The semiconductor memory device according to claim 1, wherein the one interconnect portion of the plurality of interconnect portions continuously overlaps the two or more sets of the plurality of electrode layers when viewed from the stacking direction.

* * * * *